United States Patent
Yi et al.

(10) Patent No.: US 9,330,217 B2
(45) Date of Patent: May 3, 2016

(54) HOLDTIME CORRECTION USING INPUT/OUTPUT BLOCK DELAY

(71) Applicant: Lattice Semiconductor Corporation, Hillsboro, OR (US)

(72) Inventors: Yanhua Yi, Cupertino, CA (US); Jun Zhao, Fremont, CA (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/313,778

(22) Filed: Jun. 24, 2014

(65) Prior Publication Data

US 2015/0370941 A1    Dec. 24, 2015

(51) Int. Cl.
*G06F 17/50* (2006.01)
(52) U.S. Cl.
CPC ........ *G06F 17/5054* (2013.01); *G06F 17/5077* (2013.01)
(58) Field of Classification Search
CPC ............ G06F 17/5045; G06F 17/5077; G06F 17/5031; G06F 17/5081; G06F 11/261; G06F 17/5022; G06F 17/5054; G06F 2217/84; G06F 17/5009; G06F 17/5036; G06F 17/504; G06F 17/5072; G06F 2217/06; G06F 1/04; G06F 1/3275
USPC .................................................. 716/100–106
See application file for complete search history.

(56) References Cited

U.S. PATENT DOCUMENTS

| | | | | |
|---|---|---|---|---|
| 6,763,506 | B1 * | 7/2004 | Betz et al. .................... | 716/108 |
| 7,312,631 | B1 * | 12/2007 | Bauer et al. ................... | 326/38 |
| 7,863,931 | B1 | 1/2011 | Zhang et al. | |
| 8,461,894 | B1 | 6/2013 | Zhang et al. | |

OTHER PUBLICATIONS

Lattice Semiconductor Corporation, "LatticeECP3 Family Data Sheet, DS1021 Version 02.6EA", http://www.latticesemi.com/~/media/Documents/DataSheets/Lattice/LatticeECP3EAFamilyDataSheet.pdf?document_id=31998, Mar. 2014, pp. 1-1 to 7-6.
Lattice Semiconductor Corporation, "LatticeECP3 High-Speed I/O Interface, Technical Note TN1180", http://www.latticesemi.com/~/media/Documents/ApplicationNotes/L/AM/LatticeECP3High-SpeedIOInterface.PDF?document_id=32320, Apr. 2013, pp. 12-1 to 12-144.

* cited by examiner

*Primary Examiner* — Binh Tat
(74) *Attorney, Agent, or Firm* — Michael S. Garrabrants

(57) ABSTRACT

Various techniques are provided to correct for hold time violations using input/output (I/O) block hardware of a programmable logic device (PLD) without requiring additional mapping, placement, or routing operations. In one example, a computer-implemented method includes receiving a design identifying operations to be performed by a PLD. The method also includes assigning components of the PLD to perform the operations. The method also includes routing a signal path among the components. The method also includes detecting a hold time violation for the signal path at an I/O block of the PLD. The method also includes selectively adjusting a variable delay cell of the I/O block to correct the hold time violation.

18 Claims, 4 Drawing Sheets

HOLDTIME CORRECTION USING INPUT/OUTPUT BLOCK DELAY

TECHNICAL FIELD

The present invention relates generally to programmable logic devices and, more particularly, to the adjustment of signal timing in such devices.

BACKGROUND

Programmable logic devices (PLDs) (e.g., field programmable gate arrays (FPGAs), complex programmable logic devices (CPLDs), field programmable system on a chips (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other resources) and interconnections available in particular PLDs. Physical placement and routing for the synthesized and mapped user designs are then determined to generate configuration data for the particular PLDs.

Although the user design can be analyzed (e.g., tested) for compliance with timing requirements prior to routing, the results of such testing are merely estimates. In this regard, prior to routing, the precise signal paths between various components of the PLD are unknown. As a result, pre-routing timing estimates are often inaccurate, as the actual signal timing can be affected by the particular signal routing within the PLD.

However, if a timing error is detected after routing, one or more mapping, placement, and/or routing operations typically must be repeated to correct the error. All of these repeated operations can require significant processing time and resources.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with embodiments set forth herein, techniques are provided to adjust PLD signal timing after synthesis, mapping, placement, and routing operations of a design process have been performed. For example, hold time errors may be corrected by selectively delaying an input signal received at an input/output (I/O) block of a PLD using delay circuitry implemented in the I/O block. By correcting hold time errors using the I/O block hardware, changes to configured logic blocks and routing resources of the PLD are not required. As a result, the previous operations of the design process need not be repeated to correct such errors.

Figure 1:
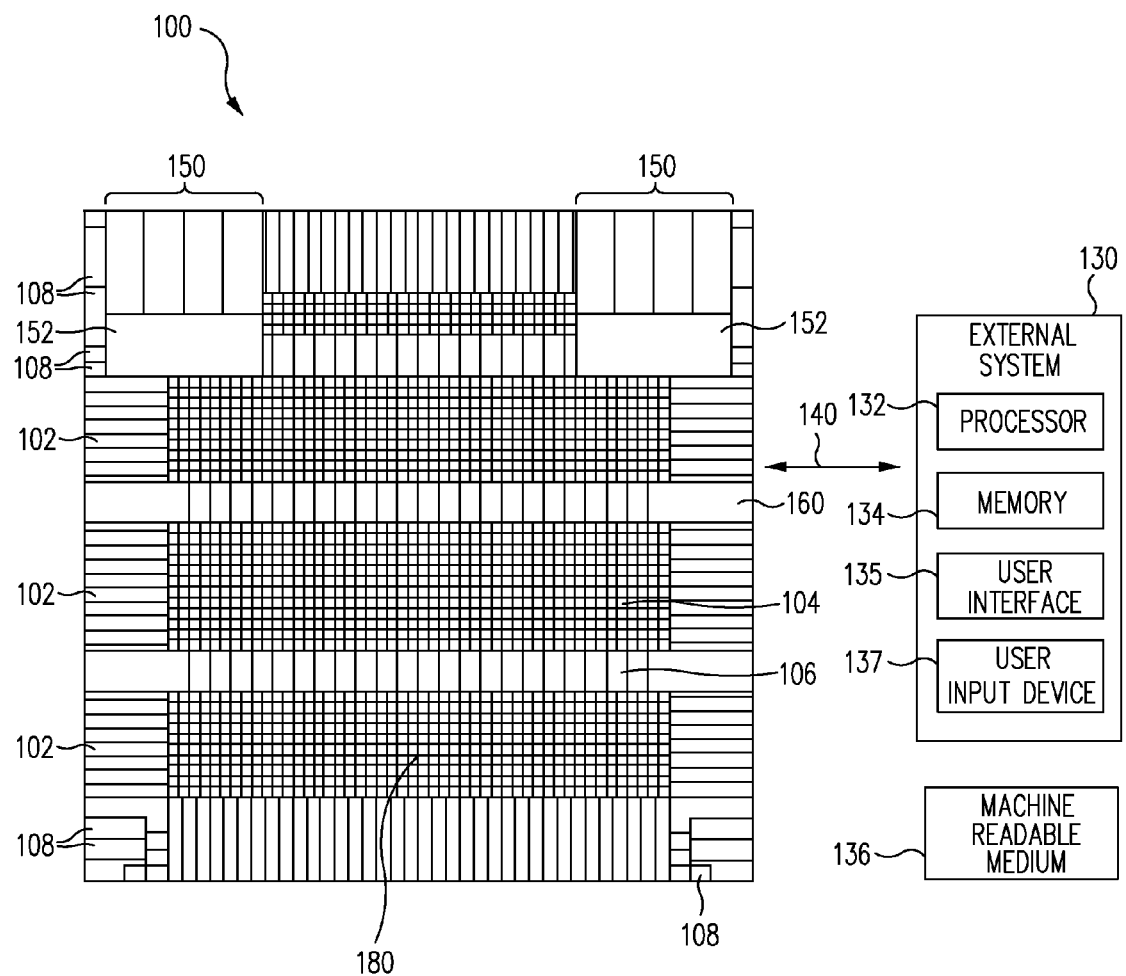
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA), a complex programmable logic device (CPLD), a field programmable system on a chip (FPSC), or other type of programmable device) generally includes I/O blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) and/or registers for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, I/O blocks 102 may be used for programming PLD 100, such as memory 106 or transferring information (e.g., various types of data and/or control signals) to/from PLD 100 through various external ports as would be understood by one skilled in the art. I/O blocks 102 may provide a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 typically, for example, may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 (e.g., also referred to as an external device) may be used to create a desired configuration of PLD 100 in accordance with a user design and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, routing resources 180, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine-readable mediums 136 (e.g., a memory or other appropriate storage medium internal or external to system 130). For example, in some embodiments, system 130 may run a PLD configuration application, such as Lattice Diamond System Planner software available from Lattice Semiconductor Corporation to permit a user to create and test a desired configuration, and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100 and/or to identify various triggers used to evaluate the operation of PLD 100, as further described herein.

Figure 2:
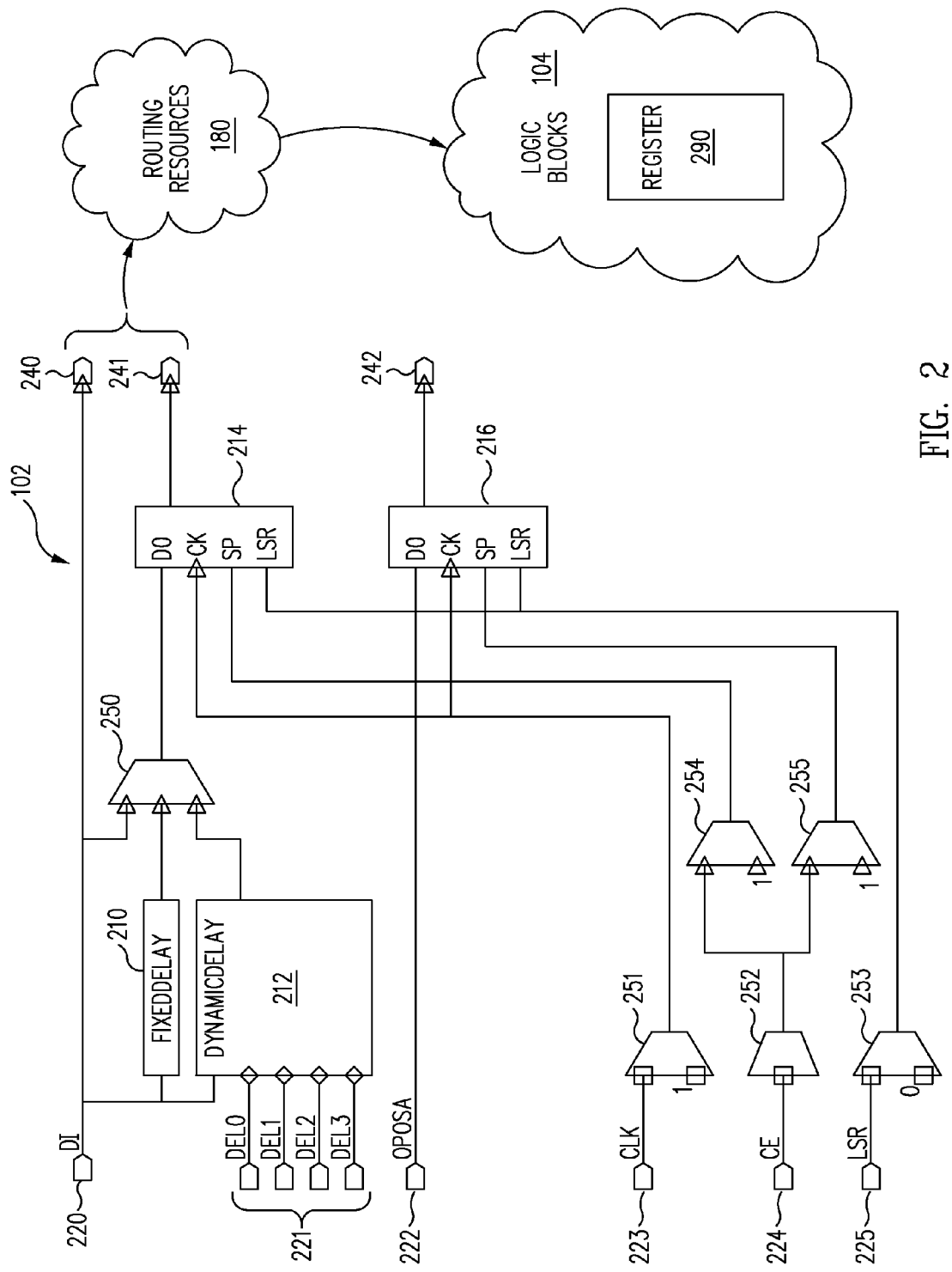
FIG. 2 illustrates an input/output block of a PLD in accordance with an embodiment of the disclosure.

FIG. 2 illustrates an I/O block 102 of PLD 100 in accordance with an embodiment of the disclosure. The particular structure of I/O block 102 shown in FIG. 2 may be used, for example, where PLD 100 is implemented as an ECP3 FPGA or an XO2 FPGA available from Lattice Semiconductor Corporation.

I/O block 102 includes a fixed delay cell 210, a variable delay cell 212 (e.g., also referred to as a dynamic delay cell), registers 214 and 216 (e.g., flip flops), ports 220-225 and 240-242, and multiplexers 250-255.

Port 220 (e.g., corresponding to an external pin of PLD 100) receives an input signal DI (e.g., a signal originating from an external device). Input signal DI is provided to port 240, multiplexer 250, fixed delay cell 210, and variable delay cell 212.

Fixed delay cell 210 is implemented in hardware and delays signal DI by a constant time period (e.g., several nanoseconds). Variable delay cell 212 is implemented in hardware and delays signal DI by a selectable time period, for example, from zero to 0.675 nanoseconds (e.g., in 15 steps of 0.045 nanoseconds). In this regard, variable delay cell 212 receives delay control signals DEL0 to DEL3 through ports 221 which can set the variable delay cell 212 to delay signal DI from zero to 15 steps. Delay control signals DEL0 to DEL3 may be provided, for example, by configured portions of PLD 100 (e.g., logic blocks 104 and/or other components of PLD 100). In this regard, the setting of variable delay cell 212 may be specified as part of the operating configuration of PLD 100 (e.g., as determined by configuration data loaded into PLD 100).

Multiplexer 250 selectively passes (e.g., under the control of configured resources of PLD 100 such as logic blocks 104 and/or other components of PLD 100) input signal DI as originally received, as delayed by fixed delay cell 210, or as delayed by variable delay cell 212. The input passed signal DI is received by register 214 which captures its current value (e.g., in response to clock signal CLK). The captured value of input signal DI is passed (e.g., during a subsequent clock cycle) to port 241.

Port 222 receives an output signal OPOSA from configured resources of PLD 100. Output signal OPOSA is provided to register 216 which captures its current value (e.g., in response to clock signal CLK). As shown, the captured value of output signal OPOSA is passed (e.g., during a subsequent clock cycle) to port 242 (e.g., corresponding to an external pin of PLD 100).

Clock signal CLK is received at port 223. In various embodiments, clock signal CLK may be internal to PLD 100 (e.g., provided by clock-related circuitry 108) or external to PLD 100 (e.g., where port 223 is implemented by an external pin of PLD 100). Clock enable signal CE is received at port 224 and reset signal LSR is received at port 225, both of which can be provided by configured resources of PLD 100. Clock signal CLK, clock enable signal CE, and reset signal LSR are passed through various multiplexers 251-255 to control the operation of registers 214 and 216.

To reliably capture data at registers 214 and 216, or registers provided by logic blocks 104 or other PLD resources, data signals and clock signals must comply with various timing conditions, such as hold time constraints (e.g., also referred to as hold time requirements). In this regard, to satisfy a hold time constraint, a data signal should be held at a steady value for at least a minimum time (e.g., a hold time period) after the occurrence of a clock edge transition in order to reliably sample the data value. In some cases, the data signal can be delayed to satisfy a hold time constraint.

Input signal DI can be passed to configurable resources of PLD 100 through ports 240 or 241. As shown, port 240 receives input signal DI without any intervening registers or other latching resources. As such, when input signal DI is used in this manner, it will typically be passed from port 240 through routing resources 180 to an internal register 290 provided by a logic block 104 or other resources of PLD 100. If it becomes necessary to delay input signal DI to satisfy a hold time constraint, then the PLD configuration can be adjusted, for example, by introducing logic delays (e.g., additional logic components) and/or routing delays (e.g., increasing the signal path taken by input signal DI through routing resources 180) in the configured resources of PLD 100.

As also shown, input signal DI can be passed through register 214 and routing resources 180 to logic block 104 or other resources of PLD 100. In this case, internal register 290 may be bypassed, because input signal DI is clocked through register 214 of I/O block 102 instead. Also in this case, input signal DI can be passed through variable delay cell 212 which can be adjusted (e.g., by control signals DEL0 to DEL3) without significantly impacting other configured components of PLD 100. Because variable delay cell 212 is provided as part of I/O block 102 (e.g., typically implemented substantially at or near a physical perimeter of PLD 100) instead of deep within configured logic blocks 104 or other components of the PLD fabric, the delay time set for variable delay cell 212 can be changed with minimal or no impact on other configured resources of PLD 100.

Figure 3:
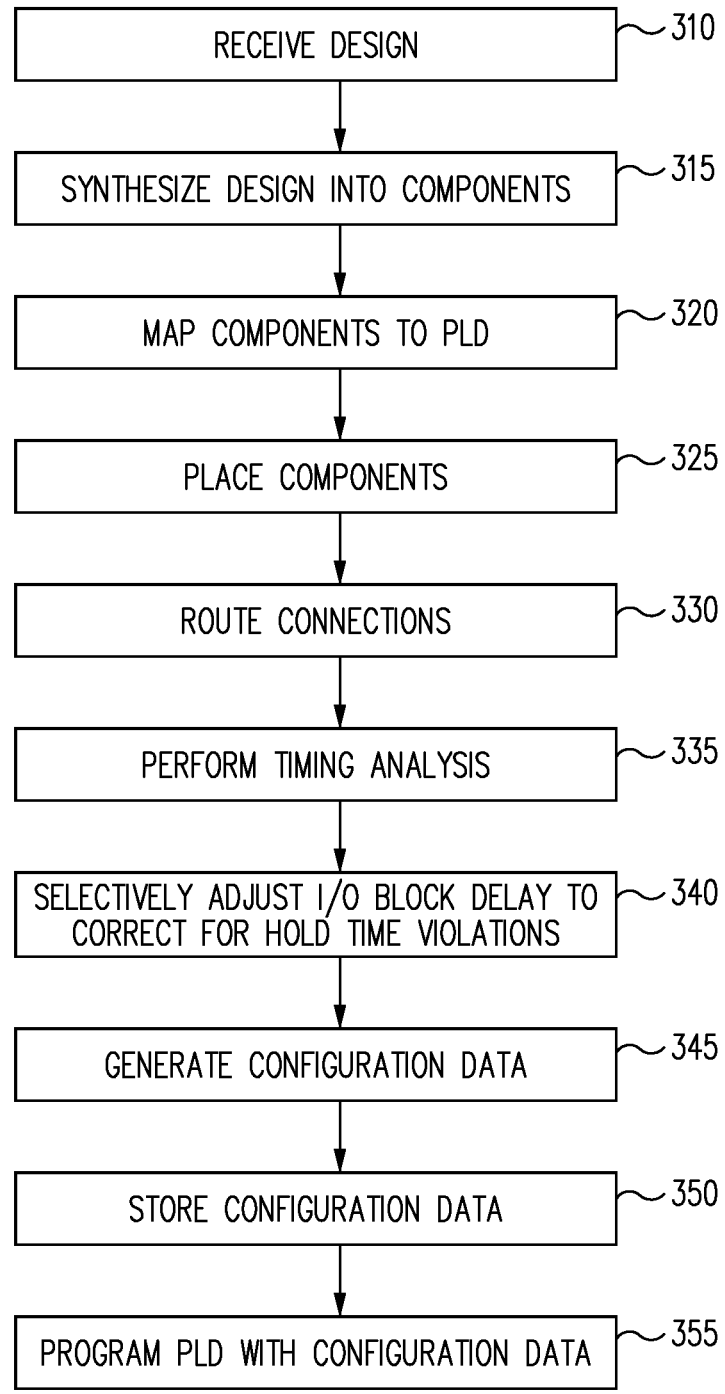
FIG. 3 illustrates a design process for a PLD in accordance with an embodiment of the disclosure.

FIG. 3 illustrates a design process for PLD 100 in accordance with an embodiment of the disclosure. For example, the process of FIG. 3 may be performed by system 130 running a configuration application as discussed. In some embodiments, the various files and information referenced in FIG. 3 may be stored, for example, in one or more databases and/or other data structures in memory 134, machine-readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the design (e.g., high level logic operations, hardware configurations, and/or other features). In some embodiments, the design may be provided in a register transfer level (RTL) description (e.g., a gate level description). System 130 may perform one or more rule checks to confirm that the design describes a valid configuration of PLD 100. For example, system 130 may reject invalid configurations and/or request the user to provide new design information as appropriate.

In operation 315, system 130 synthesizes the design to create a netlist (e.g., a synthesized RTL description) identifying an abstract logic implementation of the design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 315 may involve converting (e.g., translating) the high-level description of logic operations, hardware configurations, and/or other features in the user design into a set of PLD components (e.g., logic blocks 104 and other components of PLD 100 configured for logic, arithmetic, or other hardware functions to implement the design) and their associated interconnections or signals. Depending on embodiments, the converted design may be represented as a netlist.

In operation 320, system 130 performs a mapping process that identifies components of PLD 100 that may be used to implement the design. In this regard, system 130 may map the netlist to various types of components provided by PLD 100 (e.g., logic blocks 104, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 315 to produce a netlist that is mapped to PLD components.

In operation 325, system 130 performs a placement process to assign the mapped netlist components to particular physical components residing at specific physical locations of the PLD 100 (e.g., assigned to particular logic blocks 104 and/or other physical components of PLD 100), and thus determine a layout for the PLD 100. In some embodiments, the placement may be performed on one or more previously-stored NCD files, with the placement results stored as another physical design file.

In operation 330, system 130 performs a routing process to route connections (e.g., using routing resources 180) among the components of PLD 100 based on the placement layout determined in operation 325 to realize the physical interconnections (e.g., signal paths) among the placed components. In some embodiments, the routing may be performed on one or more previously-stored NCD files, with the routing results stored as another physical design file.

As discussed, input signal DI may be passed to configured resources of PLD 100 through ports 240 and 241. In some embodiments, the default routing for input signal DI may be through multiplexer 250, register 214, and port 241. Such an approach permits input signal DI to be selectively delayed by variable delay cell 212 and clocked in to register 214. Alternatively, input signal DI may be passed through port 240 through routing resources 180 to internal register 290 provided by a logic block 104 or other internal resources of PLD 100 (e.g., rather than using register 214).

Following operation 330, system 130 will have assigned the particular components of PLD 100 and associated signal routing to perform the operations specified in the user design. For example, one or more physical design files may be provided which specify the design after it has been synthesized (e.g., converted and optimized), mapped, placed, and routed for PLD 100 (e.g., by combining the results of the corresponding previous operations).

During the process of FIG. 3, system 130 may test the user design for compliance with various timing conditions (e.g., timing requirements). For example, multiple testing operations may be performed as part of synthesis operation 315, mapping operation 320, and/or placement operation 325. Such testing can inform and affect the results of operations 315, 320, and 325 (e.g., by iteratively performing, adjusting, and repeating such operations to improve timing compliance of the design). However, until routing operation 330 is completed, the precise signal paths between various components of PLD 100 are unknown. Thus, the results of pre-routing timing analysis are estimates which can change, depending on the particular mapping, placement, and signal routing implemented for PLD 100.

In operation 335, system 130 performs a post-routing timing analysis of the specified design (e.g., using the combined results of previous operations). In some embodiments, operation 335 includes determining compliance for hold time constraints and/or other timing constraints.

In operation 340, system 130 selectively adjusts the delay time of variable delay cell 212 to correct for hold time violations (e.g., based on the results of the timing analysis of operation 335).

Figure 4:
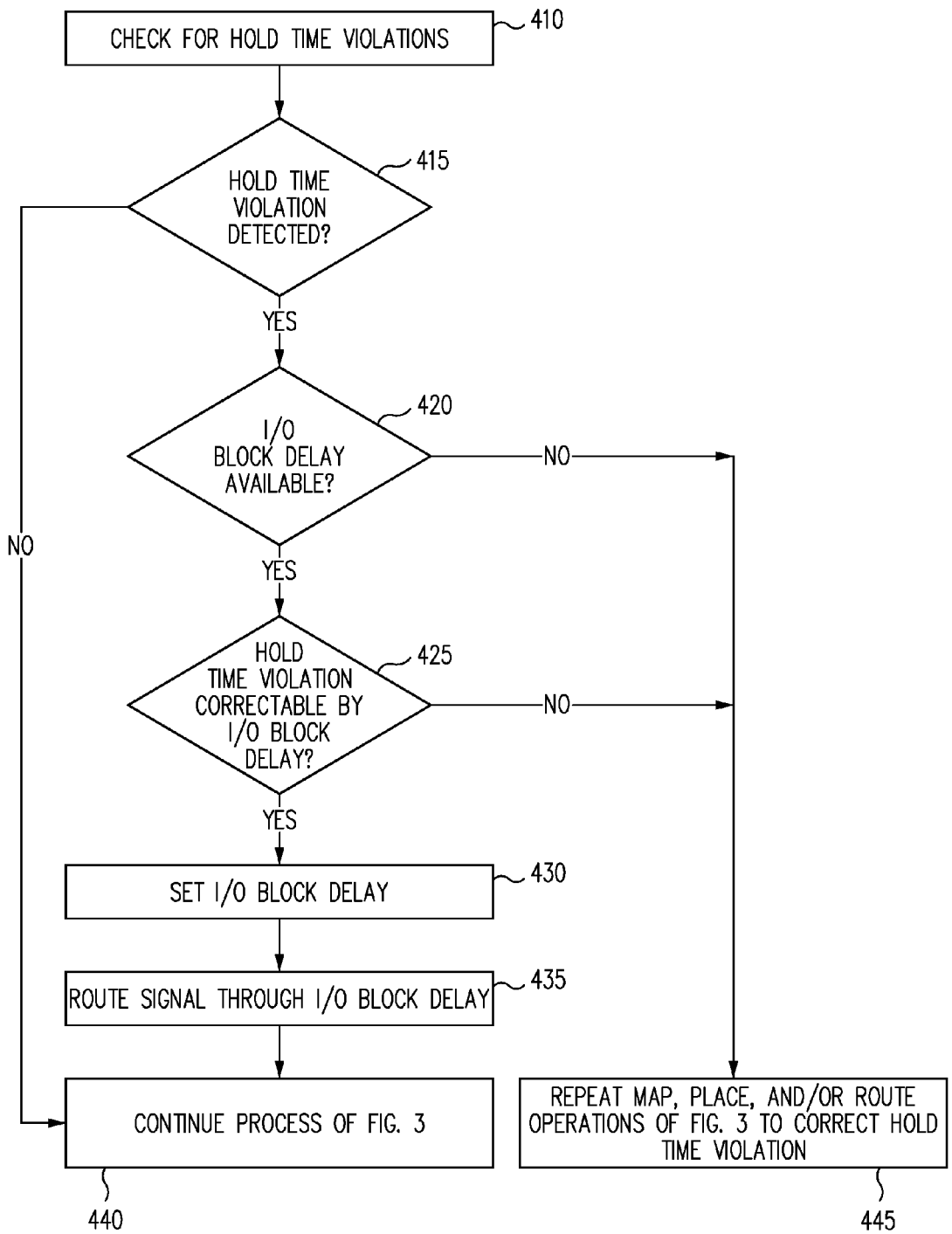
FIG. 4 illustrates a hold time adjustment process for a PLD in accordance with an embodiment of the disclosure.

FIG. 4 illustrates a hold time adjustment process for PLD 100 in accordance with an embodiment of the disclosure. In some embodiments, the process of FIG. 4 may be performed during operation 340 of FIG. 3 by system 130 running a configuration application as discussed.

In operation 410, system 130 checks whether any hold time violations were detected by the timing analysis of previous operation 335. In particular, system 130 may check whether any input signals DI provided to any of I/o blocks 102 exhibit hold time violations. For example, a hold time violation may occur if the value of input signal DI does not remain steady at the data signal input DO of register 214 for a sufficiently long time period (e.g., a hold time period) after the occurrence of a clock edge transition of clock signal CLK at clock signal input CK (e.g., used to clock in the data).

If a hold time violation is detected (operation 415), then system 130 proceeds to operation 420. Otherwise, system 130 continues the process of FIG. 3 (operation 440, further described herein).

In operation 420, system 130 checks whether variable delay cell 212 is available for use. For example, in some embodiments, variable delay cell 212 may be used for other purposes, such as to synchronize different input signals DI with each other (e.g., signals operating in double data rate (DDR) modes) to compensate for different propagation delays between input signals DI received at I/O blocks 102 distributed at various locations around the perimeter of PLD 100 (e.g., as shown in FIG. 1). Such DDR synchronization of multiple signals differs from the adjustment of input signal DI to correct for hold time violations occurring at register 214.

If variable delay cell 212 is available (operation 420), then system 130 proceeds to operation 425. Otherwise, system 130 proceeds to operation 445, further described herein.

In operation 425, system 130 determines whether the detected hold time violation is correctable by variable delay cell 212. As discussed, in some embodiments, variable delay cell 212 may delay signal DI by a selectable time period from zero to 0.675 nanoseconds, in 15 steps of 0.045 nanoseconds. Accordingly, operation 425 may include determining whether the total delay time available in variable delay cell 212 is sufficient to correct the detected hold time violation. Operation 425 may also include determining whether the different delay times available in variable delay cell 212 are sufficiently fine-grained to correct the hold time violation without compromising compliance with other timing requirements (e.g., to avoid introducing other timing constraint violations).

If the detected hold time violation is correctable by variable delay cell 212, then system 130 proceeds to operation 430. Otherwise, system 130 proceeds to operation 445.

In operation 430, system 130 sets the delay time of variable delay cell 212 to correct the hold time violation. For example, in some embodiments, operation 430 includes adjusting the values of delay control signals DEL0 to DEL3 to set the delay time.

In operation 435, system 130 routes input signal DI through variable delay cell 212 (e.g., by configuring control signals of multiplexer 250), register 214, and port 241. In operation 440, system 130 returns to the process of FIG. 3.

As discussed, because variable delay cell 212 can be adjusted without significantly impacting other configured components of PLD 100, the delay time set for variable delay cell 212 can be changed with minimal or no impact on other configured resources of PLD 100. In particular, system 130 is not required to repeat synthesis operation 315, mapping operation 320, or placement operation 325, thus saving significant processing time and resources. Accordingly, following operation 440, system 130 proceeds to operation 345 of FIG. 3 without repeating operations 315, 320, or 325.

Alternatively, if the detected hold time violation cannot be corrected by variable delay cell 212 (e.g., due to DDR usage determined in operation 420, insufficient total delay time determined in operation 425, or unsatisfactory delay time steps determined in operation 425), then system 130 will reach operation 445. In such cases, system 130 may choose to use an internal register 290 of PLD 100, rather than register 214. As a result, system 130 will loop back to one or more earlier operations in FIG. 3 (e.g., synthesis operation 315, mapping operation 320, and/or placement operation 325) to adjust configurable resources of PLD 100 to use internal register 290 (e.g., effectively bypassing register 214 by routing input signal DI to routing resources 180 through port 240 instead of port 241) and introduce logic delays and/or routing delays (e.g., using logic blocks 104, routing resources 180, and/or other available components) to correct the hold time violation. System 130 will then repeat operation 340 and continue through the process of FIG. 3 as discussed herein.

Although FIG. 4 has been described with regard to a single input signal DI, the various operations of FIG. 4 may be performed to correct for hold time violations associated with any desired number of input signals and I/O blocks.

Referring again FIG. 3, in operation 345 (following operation 440 of FIG. 4), system 130 generates configuration data for the synthesized, mapped, placed, and routed design, and as further corrected by I/O block delay settings and routings determined in FIG. 4.

In operation 350, the configuration data is stored for subsequent use by PLD 100. For example, in some embodiments, the configuration data is stored in a non-volatile memory (e.g., within PLD 100 itself or external to PLD 100 such as in machine-readable medium 136).

In operation 355, PLD 100 is programmed (e.g., configured) with the configuration data. For example, when PLD 100 is started (e.g., powered on), the configuration data is loaded from the non-volatile memory into appropriate volatile memory of PLD 100 to configure PLD 100 for use. In other embodiments, the configuration data is stored by system 130 and/or machine-readable medium 136 and loaded into appropriate volatile memory of PLD 100 when PLD is started.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine-readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method, comprising actions performed by a processor of:
    receiving a design identifying operations to be performed by a programmable logic device (PLD);
    assigning components of the PLD to perform the operations; routing
    a signal path among the components;
    detecting a hold time violation for the signal path at an input/output (I/O) block of the PLD;
    characterizing an amount of delay required to correct the hold time violation for the signal path;
    determining a setting for a variable delay cell in the I/O block that adds the characterized amount of delay to the signal path;
    and
    providing logic in the design of the PLD coupled with a configuration port of the variable delay cell, which applies a signal to the variable delay cell to set the variable delay cell of the I/O block according to the determined setting to correct the hold time violation.

2. The method of claim 1, the actions further comprising generating configuration data in accordance with the assigned components, the determined setting for the variable delay cell and the signal path without repeating the assigning and the routing.

3. The method of claim 2, the actions further comprising loading the configuration data into memory of the PLD to configure the PLD for operation.

4. The method of claim 1, the actions wherein the routing comprises routing the signal path from a register of the I/O block to a logic block of the PLD.

5. The method of claim 4, the actions further comprising, if the variable delay cell is unable to correct the hold time violation: bypassing the register of the I/O block; and
routing the signal path to a register of the logic block of the PLD.

6. The method of claim 1, wherein the assigning comprises:
synthesizing the design into a logic implementation;
mapping the logic implementation to the PLD components; and determining positions of the PLD components.

7. The method of claim 1, wherein the signal path includes an external pin of the PLD.

8. The method of claim 1, wherein the I/O block is positioned substantially at a perimeter of the PLD.

9. The method of claim 1, wherein the variable delay cell is adjustable in increments of approximately 0.045 nanoseconds.

10. A system comprising:
a processor; and
a memory adapted to store a plurality of computer-readable instructions which when executed by the processor are adapted to cause the processor to perform a method comprising:
receiving a design identifying operations to be performed by a programmable logic device (PLD),
assigning components of the PLD to perform the operations,
routing a signal path among the components,
detecting a hold time violation for the signal path at an input/output (I/O) block of the PLD,
characterizing an amount of delay required to correct the hold time violation for the signal path;
determining a setting for a variable delay cell in the I/O block that adds the characterized amount of delay to the signal path;
and
providing logic in the design of the PLD coupled with a configuration port of the variable delay cell, and which applies a signal to the variable delay cell to set the variable delay cell of the I/O block according to the determined setting to correct the hold time violation.

11. The system of claim 10, wherein the method further comprises generating configuration data in accordance with the assigned components, the determined setting for the variable delay cell and the signal path without repeating the assigning and the routing.

12. The system of claim 11, wherein the method further comprises loading the configuration data into memory of the PLD to configure the PLD for operation.

13. The system of claim 10, wherein the routing comprises routing the signal path from a register of the I/O block to a logic block of the PLD.

14. The system of claim 13, wherein the method further comprises, if the variable delay cell is unable to correct the hold time violation:
bypassing the register of the I/O block; and
routing the signal path to a register of the logic block of the PLD.

15. The system of claim 10, wherein the assigning comprises:
synthesizing the design into a logic implementation;
mapping the logic implementation to the PLD components; and determining positions of the PLD components.

16. The system of claim 10, wherein the signal path includes an external pin of the PLD.

17. The system of claim 10, wherein the I/O block is positioned substantially at a perimeter of the PLD.

18. A non-transitory machine-readable medium storing a plurality of machine-readable instructions which when executed by one or more processors of a computer system are adapted to cause the computer system to perform a computer-implemented method comprising:
receiving a design identifying operations to be performed by a programmable logic device (PLD);
assigning components of the PLD to perform the operations; routing
a signal path among the components;
detecting a hold time violation for the signal path at an input/output (I/O) block of the PLD;
characterizing an amount of delay required to correct the hold time violation for the signal path;
determining a setting for a variable delay cell in the I/O block that adds the characterized amount of delay to the signal path;
and
providing logic in the design of the PLD coupled with a configuration port of the variable delay cell, and which applies a signal to the variable delay cell to set the variable delay cell of the I/O block according to the determined setting to correct the hold time violation.

* * * * *